United States Patent [19]

Fedak

[11] 4,378,902
[45] Apr. 5, 1983

[54] APPARATUS FOR PREVENTING WIRE SAG IN THE WIRE BONDING PROCESS FOR PRODUCING SEMICONDUCTOR DEVICES

[75] Inventor: Tibor Fedak, Huntingdon Valley, Pa.

[73] Assignee: The Jade Corporation, Huntingdon Valley, Pa.

[21] Appl. No.: 235,327

[22] Filed: Feb. 17, 1981

[51] Int. Cl.³ ............................................... H05K 1/04
[52] U.S. Cl. ................................ 228/6 A; 228/180 A; 29/589; 29/827; 29/860
[58] Field of Search ............ 228/1 R, 4.5, 6 A, 180 A; 29/740, 741, 589, 840, 843, 860, 827

[56] References Cited

U.S. PATENT DOCUMENTS

| 3,934,336 | 1/1976 | Morse | 29/827 |
| 4,053,096 | 11/1977 | Heim | 228/4.5 |
| 4,063,990 | 12/1977 | Volz et al. | 156/580 |
| 4,140,265 | 2/1979 | Morino | |

FOREIGN PATENT DOCUMENTS 112664 10/1978 Japan ...................................... 29/589

Primary Examiner—Nicholas P. Godici
Assistant Examiner—M. Jordan
Attorney, Agent, or Firm—Seidel, Gonda, Goldhammer & Panitch

[57] ABSTRACT

In an apparatus for the assembly of microcomponents semiconductor devices, an improvement is provided for the step involving wire bonding of thin gold wires between conductor pads on the semiconductor chip and the external leads. In this type of apparatus generally, the wire bonding step involves the bonding of thin gold conductor wires between the conductor pads and the external leads. In the type apparatus wherein the present invention is provided, a lower anvil articular upward to a position underneath and supporting the semiconductor chip during the bonding process and then articulates downward away from the chip after bonding. The wires are placed and bonded by a capillary tube which articulates between positions above the bonding pads of the chip and the leads. The improvement comprises a wall disposed from the lower anvil and surrounding the chip between the conducting pads and the leads, whereby the wires are supported by the wall as they are withdrawn from the capillary tube.

1 Claim, 3 Drawing Figures

APPARATUS FOR PREVENTING WIRE SAG IN THE WIRE BONDING PROCESS FOR PRODUCING SEMICONDUCTOR DEVICES

BACKGROUND OF THE INVENTION

This invention relates to the process of wire bonding in the production of semiconductor devices, wherein extremely thin conductor wires are bonded between contact pads on the semiconductor chip and relatively large external connector leads on a lead frame.

The modern assembly process for microcomponent semiconductor devices is largely automated to increase productivity by reducing cost and increasing assembly rates. In this automated process, the external leads for connecting the semiconductor device into a circuit are contained on a flexible strip of lead frames. Each frame of the strip contains the external leads for one semiconductor device. The frame also contains a supporting platform, or "paddle", on which the semiconductor chip will be attached. Thin conducting wires are attached between conductor pads on the chip and the external leads of the frame. The support portions of the frame are then cut away, leaving the external leads and the mounted semiconductor as a finished circuit element.

The automated process in such assembly is usually carried out on a single assembly machine, and involves sequencing the lead frame strip through the machine in steps of one frame-width each. At selected positions in the sequence machine tools affix the semiconductor chip to the support paddle, bond the thin wires between the chip and the external leads, cut away the support structure of the frame, and bend the external leads into a desired configuration.

This invention relates particularly to the step in the above process wherein the thin conductor wires are bonded between the semiconductor chip and the external leads. These thin wires are often flexible gold alloy having extremely thin diameters relative to their length. They are normally applied through a moving capillary tube from the mouth of which the connecting wire emerges. The capillary tube is mounted on an automated arm which controls the path of the tube and thus the placement of the wires. The path is normally such that the capillary tube reciprocates downward to place a portion of gold wire on a contact pad of the semiconductor chip where it is bonded thereto by known wire bonding means. The capillary tube then moves upward and across to the external leads, whereby the wire is drawn from the mouth of the tube. The capillary then reciprocates downward again to place the wire on the external leads, where it is severed and bonded to the lead.

One of the problems inherent in this capillary bonding process arises from the flexibility of the thin gold wire. As gold is relatively flexible, and the wire has an extremely small diameter relative to its length, the wire may easily sag and become short circuited on adjacent wires or the semiconductor chip, or even become fouled with projecting edges of the assembly machine as the film strip is advanced.

Possible solutions to the above problem include increasing the diameter of the gold wire, or of shortening the length of the gold wires by reducing the distance between the semiconductor chip and the tips of the external leads. Both of these solutions, however, have economic liabilities. Increasing the diameter of the wire means that an increased amount of gold must be used. Changing the dimensions of the external lead frame means that a standardized lead frame cannot be used. Instead, a new lead frame must be used for each size semiconductor chip. This would entail extensive retooling costs that are preferably avoided. Moreover, where there are a large number of external leads on the frame, there is a limit to how much the leads can be elongated toward the frame center without reducing the spacing between leads excessively.

The present invention relates to a straightforward yet effective means of preventing this undesirable sag of the thin gold wires, yet allows the use of a relatively small diameter wire and of standardized lead frames. The details of this invention and the manner in which it accomplishes the above objectives will become apparent upon reading the descriptions which follow.

BRIEF SUMMARY OF THE INVENTION

In an apparatus for the assembly of microcomponents semiconductor devices, an improvement is provided for the step involving wire bonding of thin gold wires between conductor pads on the semiconductor chip and the external leads. In this type of apparatus generally, the wire bonding step involves the bonding of thin gold conductor wires between the conductor pads and the external leads. In the type apparatus wherein the present invention is provided, a lower anvil articulates upward to a position underneath and supporting the semiconductor chip during the bonding process and then articulates downward away from the chip after bonding. The wires are placed and bonded by a capillary tube which articulates between positions above the bonding pads of the chip and the leads. The improvement comprises a wall disposed from the lower anvil and surrounding the chip between the conducting pads and the leads, whereby the wires are supported by the wall as they are withdrawn from the capillary tube.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

DETAILED DESCRIPTION OF THE SPECIFICATION

Figure 1:
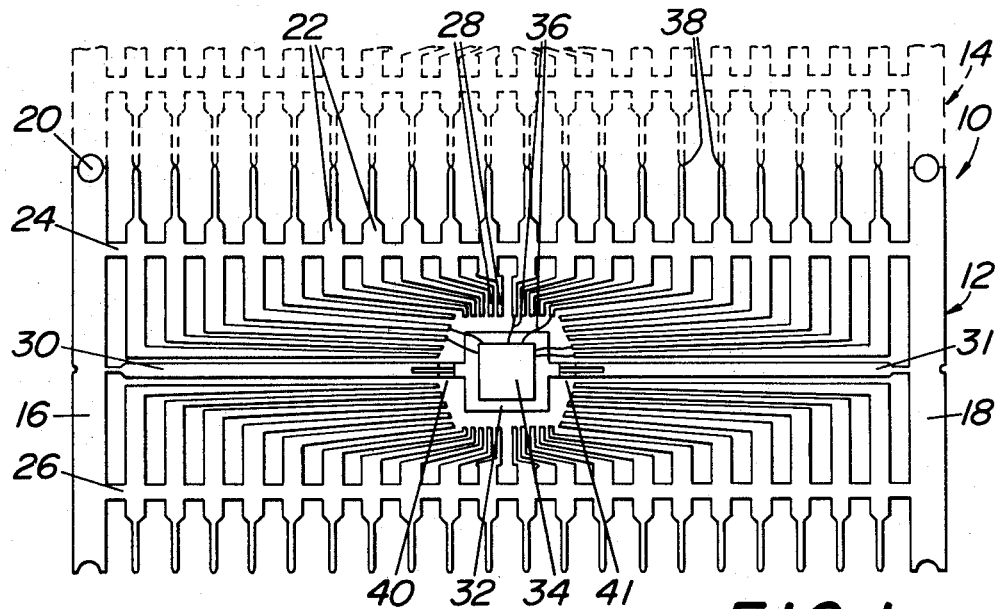
FIG. 1 is a top view of a lead strip used in the assembly of semiconductor devices showing one complete frame and portions of the subsequent frame.

Referring now to the drawings, wherein like numerals indicate like elements, in FIG. 1 is shown a lead frame strip 10 for use in the automated assembly of microcomponent semiconductor devices. Strip 10 comprises a continuous series of connected lead frames, such as frame 12, shown in its entirety, and frame 14, of which a portion is depicted. Frame 12 includes lateral support members 16 and 18 which provide sufficient rigidity to support the frame in a generally flat plane as the strip is advanced through the assembly machine.

Indexing slots 20 are provided in the support members 16, 18, so that the strip may be advanced in frame-by-frame steps by a sprocket wheel which engages the indexing slots 20.

The entire lead frame strip 10 is preferably stamped from a sheet of electrical conducting material, such as a copper or aluminum alloy. The stamping pattern produces a plurality of conductor leads 22 which are supported by lateral supports 16 and 18 or by transverse support members 24, 26. The leads 22 will become external leads for the completed microcomponent semiconductor device, and will be used to connect that device in an electrical circuit. The free ends of the leads 22 terminate in a conventionally spaced pattern of lead tips 28 near the center of the frame 12 where the semiconductor chip will be attached.

Two members 30, 31, are attached to lateral supports 16, 18 respectively and terminate in a generally square flat support member, commonly referred to as a "paddle" 32, to which a semiconductor chip 34 will be affixed during the assembly process.

Thin gold wire leads 36 are attached during the assembly process between conductor pads 35 on the chip 34 and the lead tips 28.

After the chip 34 has been affixed to the paddle 32, and the thin wires 36 bonded between the pads 35 and the lead tips 28, the film strip 10 is cut into individual semiconductor devices by separating the individual frames from each other at cut-points 38. The cut ends of the leads 22 may then be bent approximately 90° in a plane vertical to the frame 12 in order to form the semiconductor device.

Figure 2:
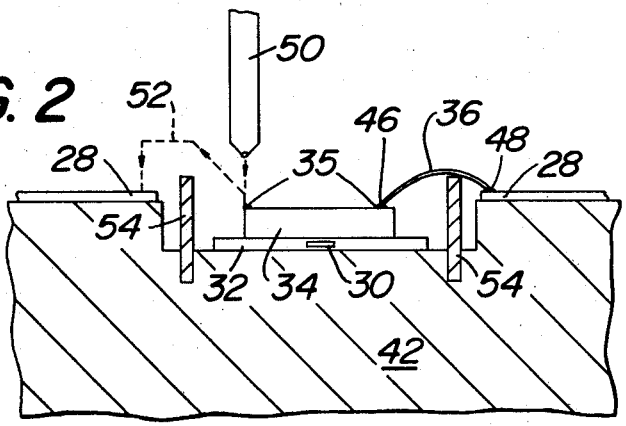
FIG. 2 is a sectional view of a lower anvil and lead frame with a semiconductor chip mounted thereon, showing the relevant components of the present invention.

This invention involves the step in the assembly process wherein the thin wires 36 are bonded between the conductor pads 35 and the lead tips 28. Referring now to FIG. 2, there is shown apparatus involved in this wire bonding step. As shown in FIG. 2, the paddle 32 is lower than the plane of the lead tips 28. This orientation is accomplished by a downward bend in leads 30, 31 at approximately the positions 40, 41 respectively, as shown in FIG. 1. This type of lead frame is used in a particular class of assembly machines, namely those in which the anvil 42 which supports the paddle 32 during the assembly process is reciprocated upward to support paddle 32 during bonding, and then reciprocated downward and away from the film strip 10 for the strip to advance. As shown in FIG. 2, reciprocating anvil 42 is in its "up" position, supporting paddle 32 for the bonding step. A representative apparatus of this type is the Series 8000 Wire Handler manufactured by The Jade Corporation of Huntington Valley, Pennsylvania.

In the bonding step, thin wires 36, preferably of gold alloy, are attached to bonding pads 44 on chip 34 by a wire bond 46. The wire bonding process is well known in the art. The other end of wire 36 is attached by a similar bond 46 to the lead tips 28.

In this bonding step, the wire 36 is attached by a capillary tube 50. Capillary tubes of the type used herein are well known, and may generally be described as hollow tubes having a narrow opening at the lower end through which the gold wire 36 protrudes. The capillary tube 50 is mounted on associated moving parts of the assembly machine (not shown in the drawing), which direct the capillary tube 50 through a predetermined path during the assembly process. A representation of that path is shown by the dotted lines 52 in FIG. 2. Thus, the capillary tube articulates downward to place a heated tip of the gold wire 36 protruding from the end of the capillary tube 50 in contact with bonding pad 35. Heat applied to the wire effects a bond between the protruding end of wire 36 and pad 35. The capillary tube 50 then moves upward and outward, drawing the wire 36 out of the open tip. The tube then moves directly outward to a position over leads 28, and then articulates downward to place the gold wire 36 on top of lead 28. Heat is applied to wire 36 and lead 28 to make a bond 48. The gold wire is severed at bond 48 and the bonding step between one pad 35 and one lead 28 is completed. A single capillary tube may progress around the chip 34 making all such bonds.

Modern processes for the manufacture of the semiconductor chips have resulted in continuing miniaturization of the chip's size, and have increased the number of leads to the chip. The external leads must have considerable width and separation from each other, with the result that increasing the number of leads requires withdrawing the perimeter of the lead tips away from the chip. This has necessitated an increased length of wire 36 to cover the increased distance between the miniaturized chips 34 and the withdrawn lead tips 28. Concomitant with this increase in wire length has been an economic incentive to reduce the diameter of the wire in order to reduce the amount of gold used. These two developments have produced an undesirable result, namely that the wire has become so flexible that it may sag downward when the capillary tube articulates downward on top of lead 28. The descending capillary tube imparts parts a whipping motion to wire 36 which exacerbates this tendency to sag. If the sag is allowed to develop, wires 36 may rest on each other at the semiconductor chip 34 causing a short circuit, and may even become fouled on projections of the assembly machine as the film strip 10 is advanced through the final assembly stages. To counter this sag, a raised wall 54 is provided in anvil 42 to support the wire 36 as it is drawn out of the capillary tube. Note that a wall 54 may be used in this category of assembly machine wherein the lower anvil articulates downward and out of the way of the film strip 10 after the bonding process so that the frames 12 may be advanced. In the next bonding step, anvil 42 and wall 54 articulate upward in position for the next bonding on the subsequent frame 12.

Figure 3:
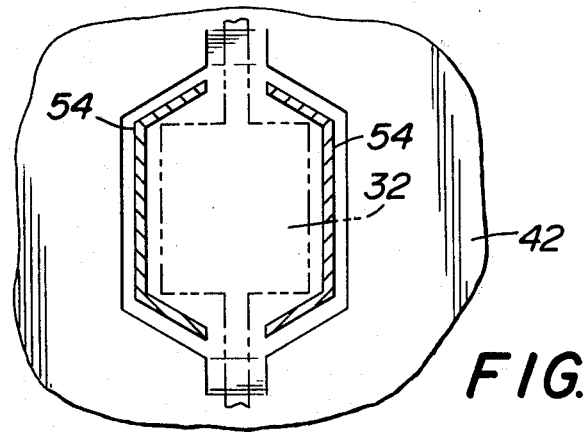
FIG. 3 is a top view of a portion of the lower anvil and lead frame shown in FIG. 2.

FIG. 3 is a top view of the apparatus shown in FIG. 2, and shows the shape of wall 54. Wall 54 encloses the entire perimeter of chip 34 over which the wires 36 will be drawn from the tube and bonded. Thus, the sag problem is eliminated for all the wire bonds through the presence of wall 54.

The present invention may be embodied in other specific forms without departing from the spirit or essential attributes thereof and, accordingly, reference should be made to the appended claims, rather than to the foregoing specification, as indicating the scope of the invention.

I claim:

1. In an apparatus for the assembly of microcomponent semiconductor devices wherein there is accomplished a step in which thin conductor wires are bonded between bonding pads on a semiconductor chip and leads for connecting the semiconductor or device to an external circuit, wherein a capillary tube from which the wire is drawn articulates between positions above a bonding pad of the chip and above a corresponding lead, and wherein a lower anvil reciprocates upward to a position underneath and supporting the chip during the bonding step and then downward away from the semiconductor chip after the bonding step, the improvement comprising a vertical wall projecting upwardly from the upper surface of the lower anvil and surrounding the chip between the bonding pads and the leads during the bonding step, the vertical height of the wall being greater than the vertical height of the chip and the leads so that the wires, after being bonded to the bonding pads, are supported by the wall as the wires are withdrawn from the capillary tube and bonded to the leads.

* * * * *